(12) United States Patent
Tsukihashi

(10) Patent No.: US 10,854,271 B2
(45) Date of Patent: Dec. 1, 2020

(54) CLOCK SIGNAL GENERATOR GENERATING FOUR-PHASE CLOCK SIGNALS

(71) Applicant: MICRON TECHNOLOGY, INC., Boise, ID (US)

(72) Inventor: Toshiaki Tsukihashi, Tama (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/372,033

(22) Filed: Apr. 1, 2019

(65) Prior Publication Data

US 2020/0312400 A1 Oct. 1, 2020

(51) Int. Cl.
*G11C 7/10* (2006.01)
*G11C 11/4076* (2006.01)
*G11C 11/4093* (2006.01)

(52) U.S. Cl.
CPC ...... *G11C 11/4076* (2013.01); *G11C 11/4093* (2013.01)

(58) Field of Classification Search
CPC .............. G11C 7/222; G11C 7/22; G06F 1/06
See application file for complete search history.

(56) References Cited

U.S. PATENT DOCUMENTS

| 10,522,208 | B1* | 12/2019 | Morishige | G06F 1/10 |
| 2009/0316493 | A1* | 12/2009 | Kim | G11C 7/22 |
| | | | | 365/189.05 |
| 2012/0224656 | A1* | 9/2012 | Aoki | H04L 25/0274 |
| | | | | 375/316 |
| 2018/0275713 | A1* | 9/2018 | Srivastava | G06F 13/4291 |

\* cited by examiner

*Primary Examiner* — Toan K Le
(74) *Attorney, Agent, or Firm* — Dorsey & Whitney LLP

(57) ABSTRACT

Disclosed herein is an apparatus that includes a clock generator configured to generate first, second, third, and fourth clock signals different in phase from one another, and first, second, third, and fourth clock drivers each configured to drive the first, second, third, and fourth clock signals, respectively. The first and second clock drivers are arranged symmetrically with respect to a first line extending in a first direction. The first and third clock drivers a arranged symmetrically with respect to a second line extending in a second direction. The first and fourth clock drivers are arranged symmetrically with respect to a point crossing the first and second lines.

20 Claims, 15 Drawing Sheets

CLOCK SIGNAL GENERATOR GENERATING FOUR-PHASE CLOCK SIGNALS

BACKGROUND

A semiconductor device such as a DRAM (Dynamic Random-Access Memory) sometimes includes a parallel to serial conversion circuit that converts parallel read data into serial data, and a serial to parallel conversion circuit that converts serial write data into parallel data. The parallel to serial conversion circuit performs a parallel to serial conversion operation in synchronization with read clock signals different in phase from one another, and the serial to parallel conversion circuit performs a serial to parallel conversion operation in synchronization with write clock signals different in phase from one another. However, if the read clock signals or the write clock signals are generated from a clock signal for a command address, the paths of the read clock signals and the write clock signals become long In this case not only is current consumption large, there is also a problem that the phases of the read clock signals or the phases of the write clock signals are likely to be shifted.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
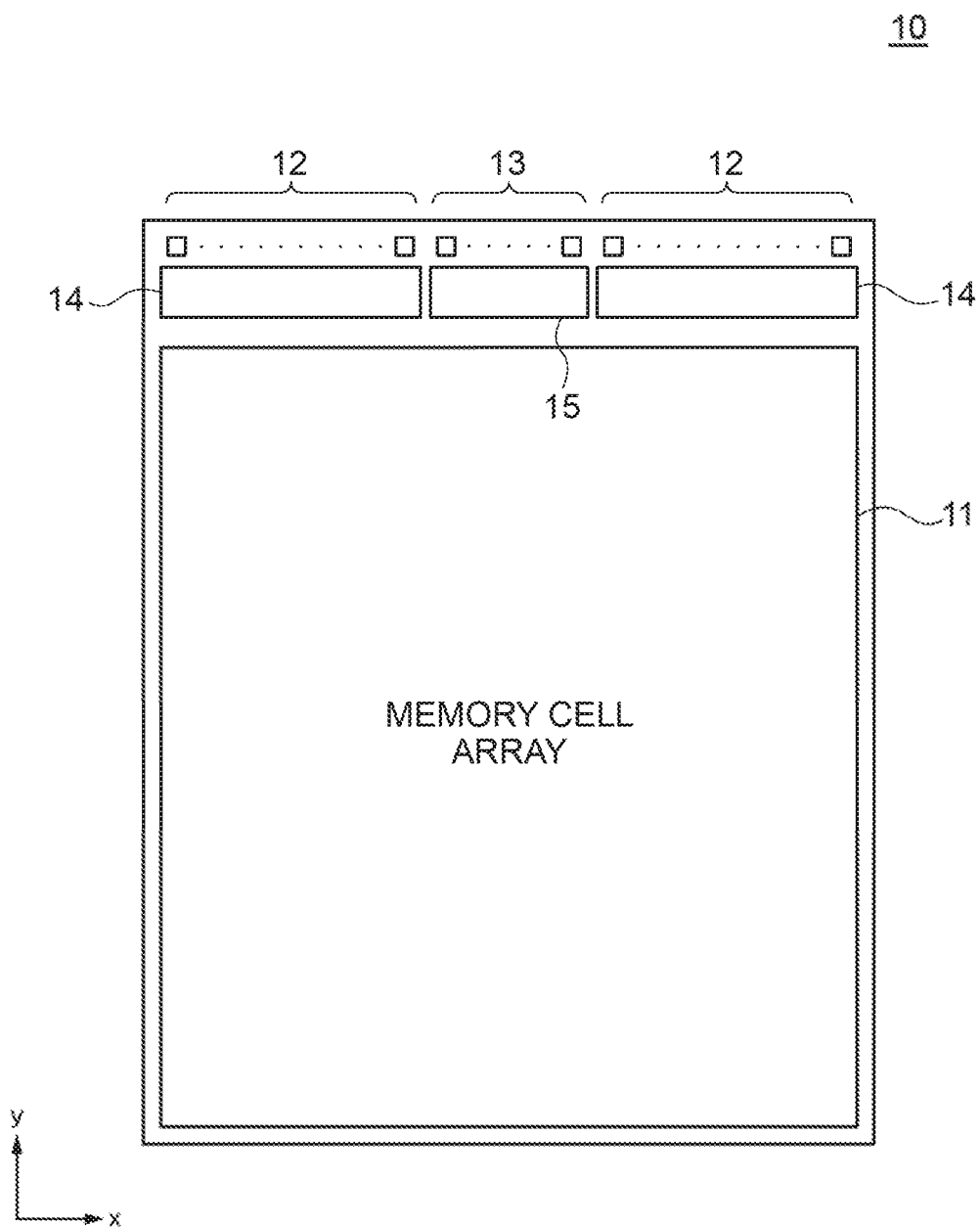
FIG. 1 is a schematic plan view showing a layout of a semiconductor device according to the present disclosure.

A semiconductor device 10 according to the present disclosure is an LPDDR5 (Low-Power Double Data Rate 5) DRAM and has a memory cell array 11, a plurality of data terminals 12, and a plurality of command address terminals 13 as shown in FIG. 1. The terminals 12 and 13 we arranged along one side extending in an x direction of the semiconductor device 10. There are also other terminals such as power terminals. The data terminals 12 are arranged in two separate locations and the command address terminals 13 are arranged therebetween. The memory cell array 11 and the data terminals 12 are connected via an I/O control circuit 14, and the memory cell array 11 and the command address terminals 13 are connected via an access control circuit 15. When read commands and address signals corresponding thereto are input from the command address terminals 13, read data that are read from the memory cell array 11 are output to the data terminals 12 via the I/O control circuit 14. When write commands and address signals corresponding thereto are input from the command address terminals 13, write data that are input to the data terminals 12 are written to the memory cell array 11 via the I/O control circuit 14.

Figure 2:
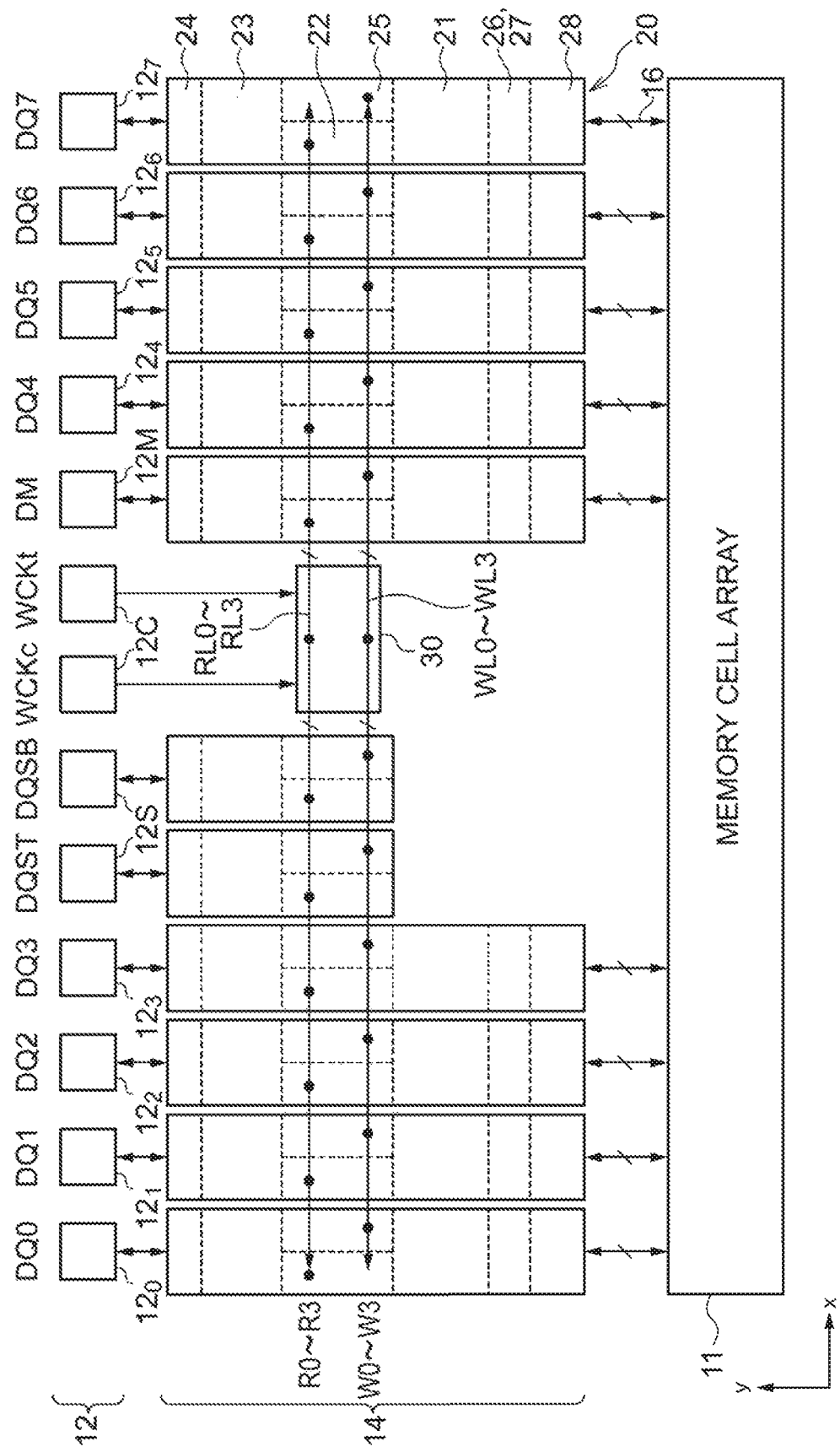
FIG. 2 is a layout diagram showing a configuration of I/O control circuits.

As shown in FIG. 2, the data terminals 12 include terminals $12_0$ to $12_7$ t/from which data DQ0 to DQ7 are input/output, respectively, a terminal 12M to/from which a data mask signal is input/output, terminals 12S to/from which complementary strobe signals DQST and DQSB are input/output, respectively, and terminals 12C to which complementary clock signals WCKt and WCKc are input, respectively. I/O control circuits 20 are respectively allocated to the terminals 12 to $12_7$ and 12M. The I/O control circuits 20 are connected to the memory cell array 11 via read/write buses 16. The I/O control circuits 20 include a read system circuit including a read data storage circuit 21, a read clock synchronization circuit (a parallel to serial conversion circuit) 22, a driver circuit 23, and an output buffer 24, and a write system circuit including an input buffer 25, a timing adjustment circuit 26, a write clock synchronization circuit (a serial to parallel conversion circuit) 27, and a write data output circuit 28. The I/O control circuits 20 are arranged in a y direction according to the x coordinates of corresponding ones of the data terminals 12, respectively, to enable read data and write data to flow in the y direction.

The clock signals WCKt and WCKc are input to a clock signal generation circuit 30. The clock signal generation circuit 30 generates read clock signals R0 to R3 and write clock signals W0 to W3 on the basis of the clock signals WCKt and WCKc. The read clock signals R0 to R3 are different in phase from one another by 90 degrees and are supplied to the read clock synchronization circuit 22 via read clock lines RL0 to RL3, respectively. The read clock synchronization circuit 22 performs a parallel to serial conversion operation of read data in synchronization with the read clock signals R0 to R3. The write clock signals W0 to W3 are different in phase from one another by 90 degrees and are supplied to the input buffer 25 via write clock lines WL0 to WL3, respectively. The input buffer 25 performs a serial to parallel conversion operation of write data in synchronization with the write clock signals W0 to W3. The read dock lines RL0 to RL3 and the write clock lines WL0 to WL3 all extend in the x direction.

Figure 3:
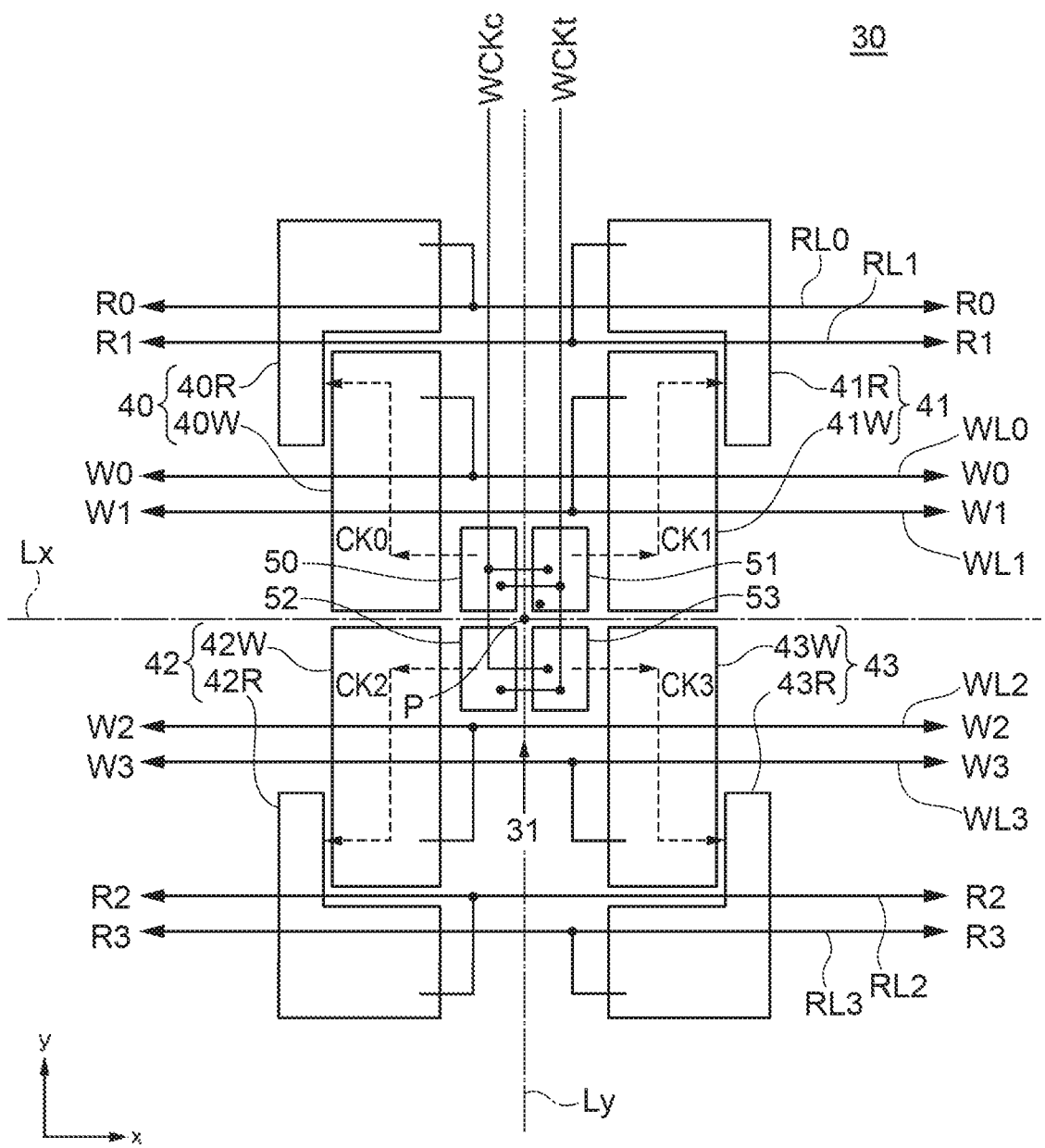
FIG. 3 is a layout diagram of a clock signal generation circuit.

FIG. 3 is a layout diagram of the clock signal generation circuit 30. As shown in FIG. 3, the clock signal generation circuit 30 has a division circuit 31 that generates divided clock signals CK0 to CK3 different in phase from one another by 90 degrees, and clock drive 40 to 43 that respectively receive the divided clock signals CK0 to CK3. The division circuit 31 has buffer circuits 50 to 53 and the divided clock signals CK0 to CK3 are output from the buffer circuits 50 to 53, respectively. The clock drivers 40 to 43 include write clock drivers 40W to 43W and read clock drivers 40R to 43R, respectively. The write clock drivers 40W to 43W generate the write clock signals W0 to W3 on the basis of the divided clock signals CK0 to CK3, respectively. The read clock drivers 40R to 43R generate the read clock signals R0 to R3 on the basis of the divided clock signals CK0 to CK3, respectively. Although not shown, the divided clock signals CK0 to CK3 can branch off at output parts of the division circuit 31 to execute control in such a manner that the divided clock signals CK0 to CK3 respectively input to the write clock drivers 40W to 43W are activated only during a write time and to similarly execute control in such a manner that the divided clock signals CK0 to CK3 respectively input to the read clock drivers 40R to 43R are activated only during a read time. It is alternatively possible to activate only the read clock drivers 40R to 43R which are more distant during a read time.

The write clock drivers 40W to 43W are located outside the division circuit 31 to surround the division circuit 31. The read clock drivers 40R to 43R are located outside the write clock drivers 40W to 43W to surround the write clock drivers 40W to 43W and the division circuit 31. The clock driver 40 and the clock driver 41 are laid out symmetrically with respect to a virtual straight line Ly extending in the y direction. Similarly, the clock driver 42 and the clock driver 43 are laid out symmetrically with respect to the virtual straight line Ly extending in the y direction. Further, the clock driver 40 and the clock driver 42 are laid out symmetrically with respect to a virtual straight line Lx extending in the x direction. Similarly, the clock driver 41 and the clock driver 43 are laid out symmetrically with respect to the virtual straight line Lx extending in the x direction. Accordingly, the clock driver 40 and the clock driver 43 are laid out symmetrically with respect to an intersection point P of the straight line Lx and the straight line Ly. Similarly, the clock driver 41 and the clock driver 42 are laid out symmetrically with respect to the intersection point P of the straight line Lx and the straight line Ly.

The write clock signals W0 to W3 generated by the write clock drivers 40W to 43W are output to the write clock lines WL0 to WL3, respectively. Among these, the write clock lines WL0 and WL1 are laid out on the write clock drivers 40W and 41W and the write clock lines WL2 and WL3 are laid out on the write clock drivers 42W and 43W. The intersection point P of the straight line Lx and the straight line Ly is located between the write clock lines WL0 and WL1 and the write clock lines WL2 and WL3. The read clock signals R0 to R3 generated by the read clock drivers 40R to 43R are output to the read clock lines RL0 to RL3, respectively. Among these, the read clock lines RL0 and RL1 are laid out on the read clock drivers 40R and 41R and the read clock lines RL2 and RU are laid out on the read clock drivers 42R and 43R. The write clock lines WL0 to WL3 are located between the read clock lines RL0 and RL1 and the read clock lines RL2 and RL3.

With this layout, the divided clock signals CK0 to CK3 propagate radially from the division circuit 31 located at a position overlapping with the intersection point P of the straight line Lx and the straight line Ly, and are input to the clock drivers 40 to 43, respectively. Accordingly, the lengths of propagation paths of the divided clock signals CK0 to CK3 substantially match each other. Therefore, the phases of the write clock signals W0 to W3 output to the write clock lines WL0 to WL3 are less likely to be shifted and the phases of the read clock signals R0 to R3 output to the read clock lines RL0 to RL3 are less likely to be shifted.

Figure 4:
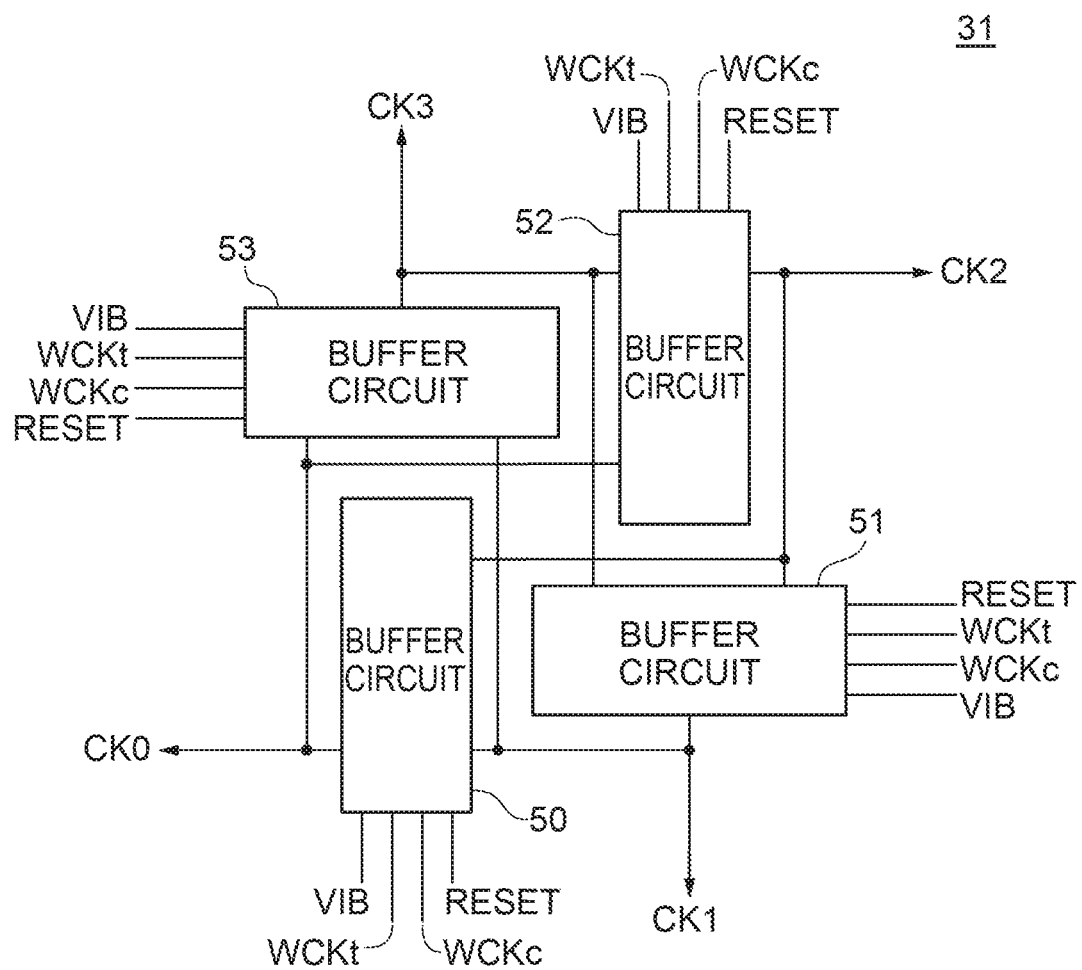
FIG. 4 is a circuit diagram of a division circuit.

FIG. 4 is a circuit diagram of the division circuit 31. As shown in FIG. 4, the division circuit 31 has the four buffer circuits 50 to 53 that receive the clock signals WCKt and WCKc. The divided clock signal CK0 output from the buffer circuit 50 is supplied to the buffer circuits 52 and 53. The divided clock signal CK1 output from the buffer circuit 51 is supplied to the buffer circuits 50 and 53. The divided clock signal CK2 output from the buffer circuit 52 is supplied to the buffer circuits 50 and 51. The divided clock signal CK3 output from the buffer circuit 53 is supplied to the buffer circuits 5 and 52.

Figure 5A:
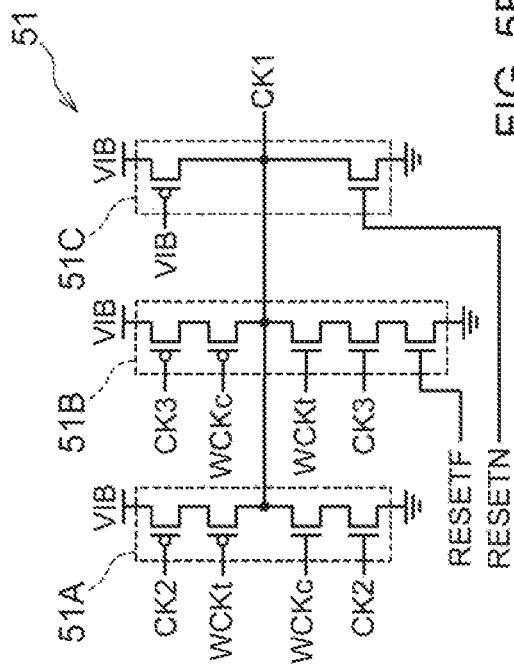
FIG. 5A to FIG. 5D are circuit diagrams of buffer circuits 50 to 53, respectively.

FIGS. 5A to 5D are circuit diagrams of the buffer circuits 50 to 53, respectively. As shown in FIG. 5A, the buffer circuit 50 has a configuration in which output nodes of tristate buffers 50A and 50B and a reset circuit 50C are wired-OR connected. The tristate buffer 50A is activated and inverts the divided clock signal CK1 when the clock signals WCKt and WCKc are at a high level and a low level, respectively. When the clock signals WCKt and WCKc are at a low level and a high level, respectively, the tristate buffer 50A becomes a high impedance state. The tristate buffer 50B is activated and inverts the divided clock signal CK2 when the clock signals WCKt and WCKc are at a low level and a high level, respectively. When the clock signals WCKt and WCKc are at a high level and a low level, respectively, the tristate buffer 50B becomes a high impedance state. The reset circuit 50C resets the divided clock signal CK0 to a low level when a reset signal RESETN becomes a high level.

Figure 5B:
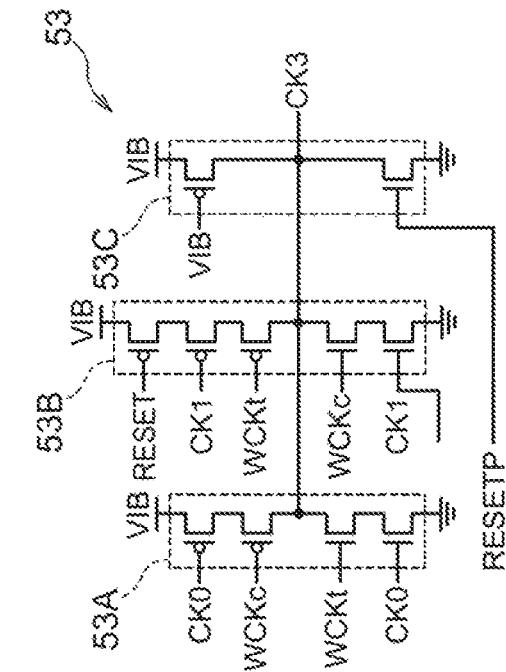

As shown in FIG. 5B, the buffer circuit 51 has a configuration in which output nodes of tristate buffers 51A and 51B and a reset circuit SC are wired-OR connected. The tristate buffer 51A is activated and inverts the divided clock signal CK2 when the clock signals WCKt and WCKc are at a low level and a high level, respectively. When the clock signals WCKt and WCKc are at a high level and a low level, respectively, the tristate buffer 51A becomes a high impedance state. The tristate buffer 51B is activated and inverts the divided clock signal CK3 when the clock signals WCKt and WCKc are at a high level and a low level, respectively. When the clock signals WCKt and WCKc are at a low level and a high level, respectively, the tristate buffer 51B becomes a high impedance state. The reset circuit SIC resets the divided clock signal CK1 to a low level when the reset signal RESETN becomes a high level.

Figure 5C:
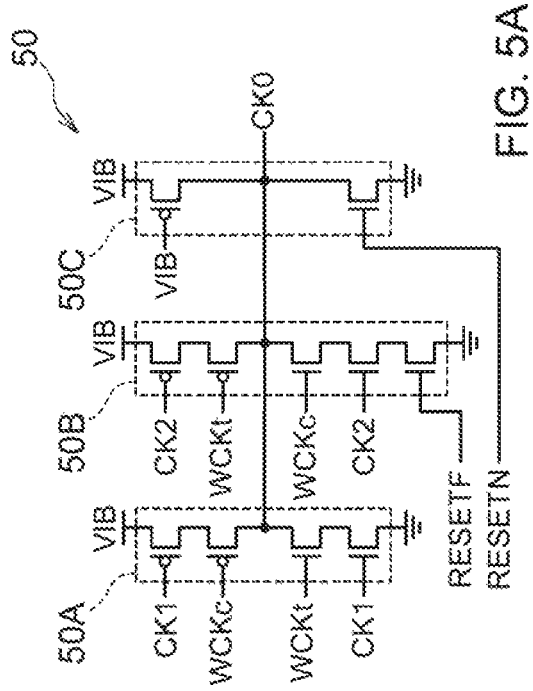

As shown in FIG. 5C, the buffer circuit 52 has a configuration in which output nodes of tristate buffers 52A and 528 and a reset circuit 52C are wired-OR connected. The tistate buffer 52A is activated and inverts the divided clock signal CK3 when the clock signals WCKt and WCKc are at a low level and a high level, respectively. When the clock signals WCKt and WCKc are at a high level and a low level, respectively, the tristate buffer 52A becomes a high impedance state. The tristate buffer 52B is activated and inverts the divided clock signal CK0 when the clock signals WCKt and WCKc are at a high level and a low level, respectively. When the clock signals WCKt and WCKc are at a low level and a high level, respectively, the tristate buffer 52B becomes a high impedance state. The reset circuit 52C resets the divided clock signal CK2 to a low level when a reset signal RESETP becomes a high level.

Figure 5D:
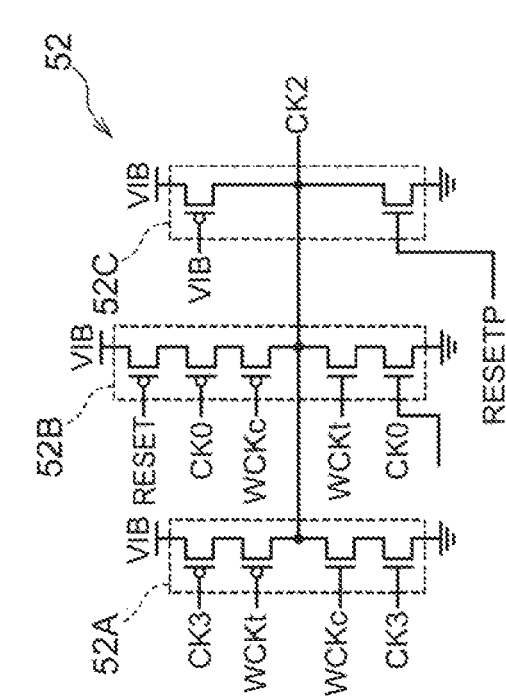

As shown in FIG. 5D, the buffer circuit 53 has a configuration in which output nodes of tristate buffers 53A and 53B and a reset circuit 53C are wired-OR connected. The tristate buffer 53A is activated and inverts the divided clock signal CK0 when the clock signals WCKt and WCKc are at a high level and a low level, respectively. When the clock signals WCKt and WCKc are at a low level and a high level, respectively, the tristate buffer 53A becomes a high impedance state. The tristate buffer 53B is activated and inverts the divided clock signal CK1 when the clock signals WCKt and WCKc are at a low level and a high level, respectively. When the clock signals WCKt and WCKc are at a high level and a low level, respectively, the tristate buffer 53B becomes a high impedance state. The reset circuit 53C resets the divided clock signal CK3 to a low level when the reset signal RESETP becomes a high level.

Figure 6:
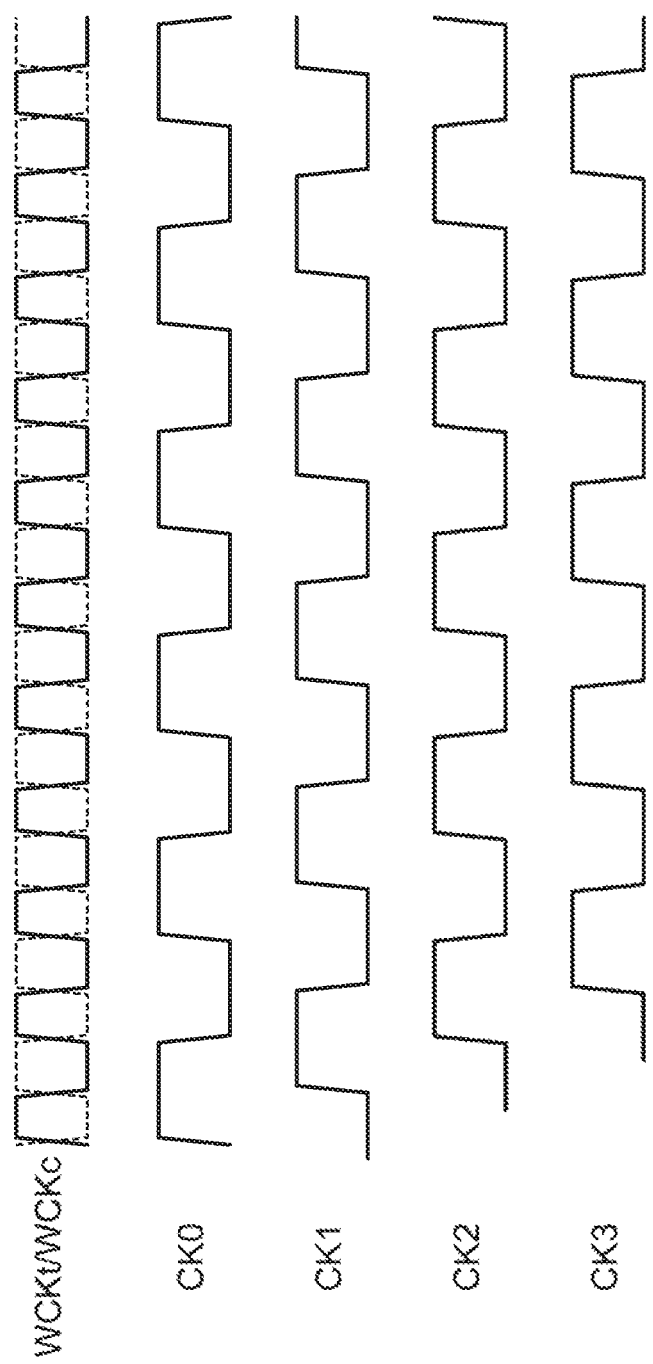
FIG. 6 is a waveform diagram of divided clock signals.

As shown in FIG. 6, the four-phase divided clock signals CK0 to CK3 having a period twice as long as that of the clock signals WCKt and WCKc are output from the division circuit 31. The phases of the divided clock signals CK0 to CK3 are different from one another by 90 degrees. As described above, the divided clock signals CK0 to CK3 radially propagate to be supplied to the clock drivers 40 to 43, respectively. The write lock signals W0 to W3 and the read clock signals R0 to R3 generated by the clock divers 40 to 43 are supplied to the I/O control circuits 20 via the write clock lines WL0 to WL3 and the read clock lines RL0 to R3 extending in the x direction.

Figure 7:
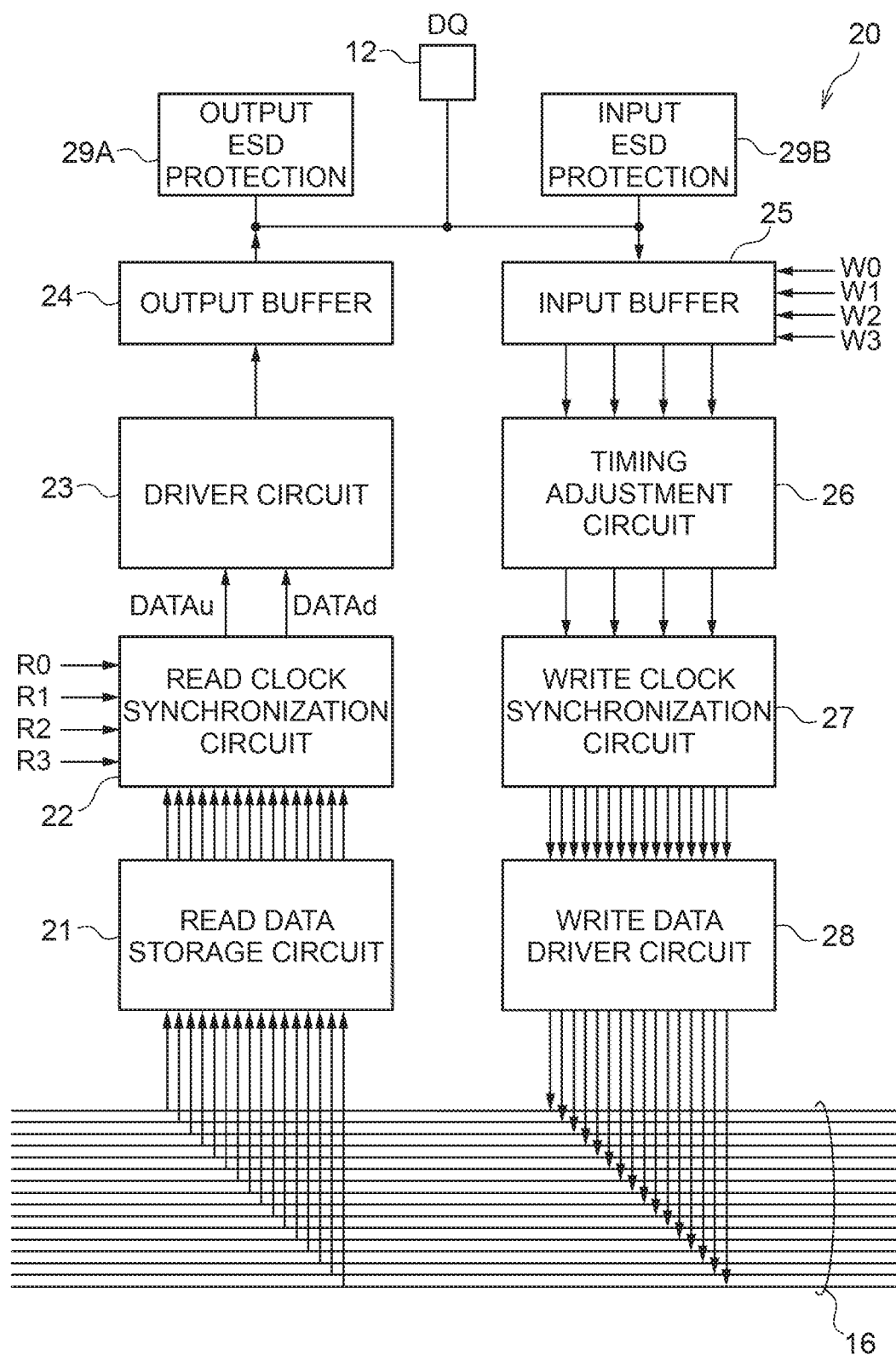
FIG. 7 is a block diagram showing a configuration of I/O control circuits.

FIG. 7 is a block diagram showing a configuration of the I/O control circuits 20. The read data storage circuit 21, the read clock synchronization circuit 22, the driver circuit 23, and the output buffer 24 constitute the read system circuit and are connected in this order between the read/write buses 16 and the data terminals 12. An output ESD (electrostatic discharge) protection circuit 29A is provided near the output buffer 24. The input buffer 25, the timing adjustment circuit 26, the write clock synchronization circuit 27, and the write data output circuit 28 constitute the write system circuit and are connected in this order between the data terminals 12 and the read/write buses 16. An input ESD protection circuit 29B is provided near the input buffer 25.

The read data storage circuit 21 stores therein parallel read data supplied from the read/write buses 16 and supplies the read data to the read clock synchronization circuit 22. The read clock synchronization circuit 22 converts the parallel read data into serial data on the basis of the read clock signals R0 to R3 to generate complementary pull-up data DATAu and pull-down data DATAd. The driver circuit 23 drives the output buffer 24 on the basis of the pull-up data DATAu and the pull-down data DATAd, whereby serial write data DQ is output from the data terminals 12. The impedance, the driver strength, and the slew rate of the output buffer 24 are adjusted by the driver circuit 23.

Figure 8:
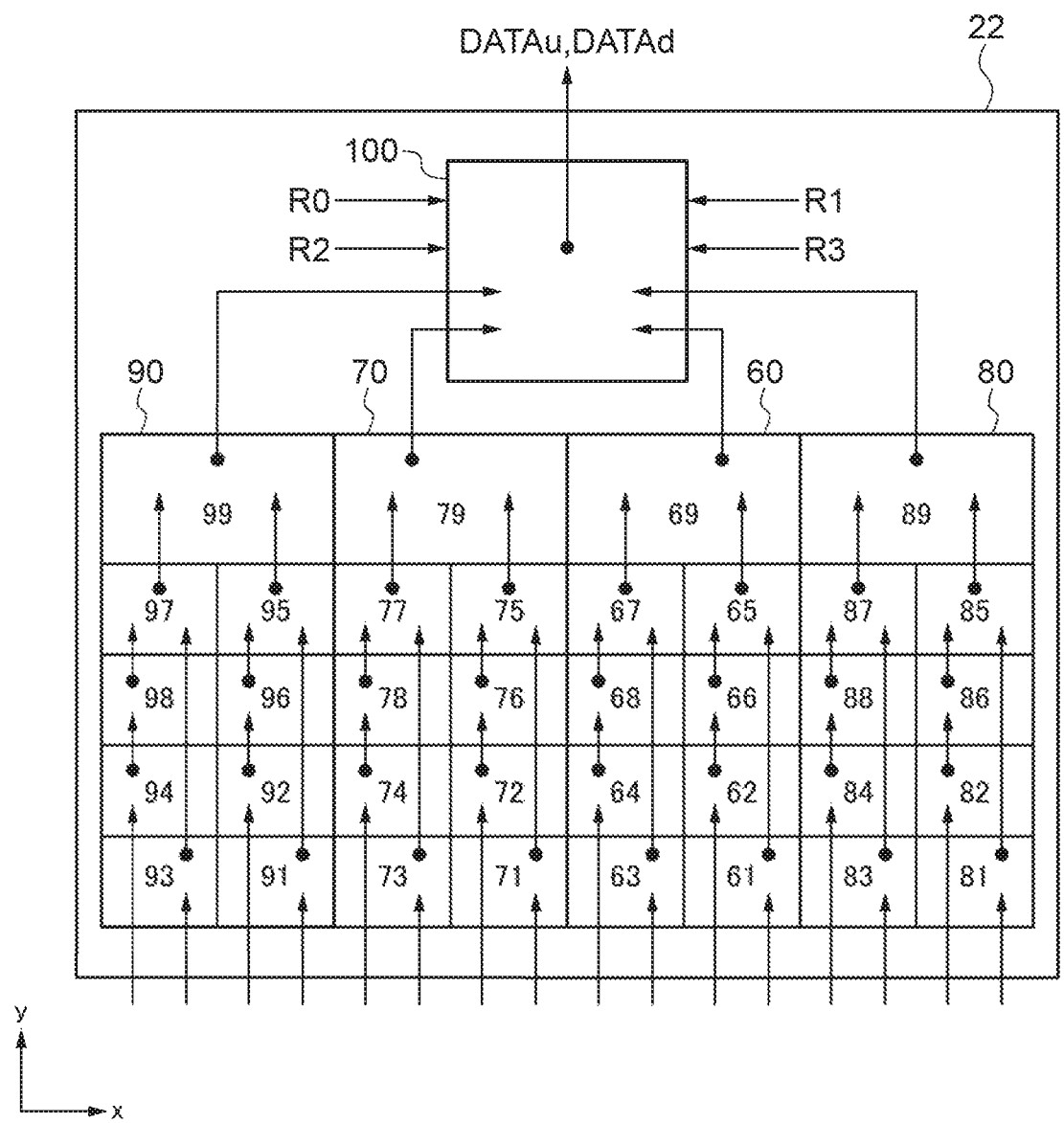
FIG. 8 is a layout diagram of a read clock synchronization circuit.
Figure 9:
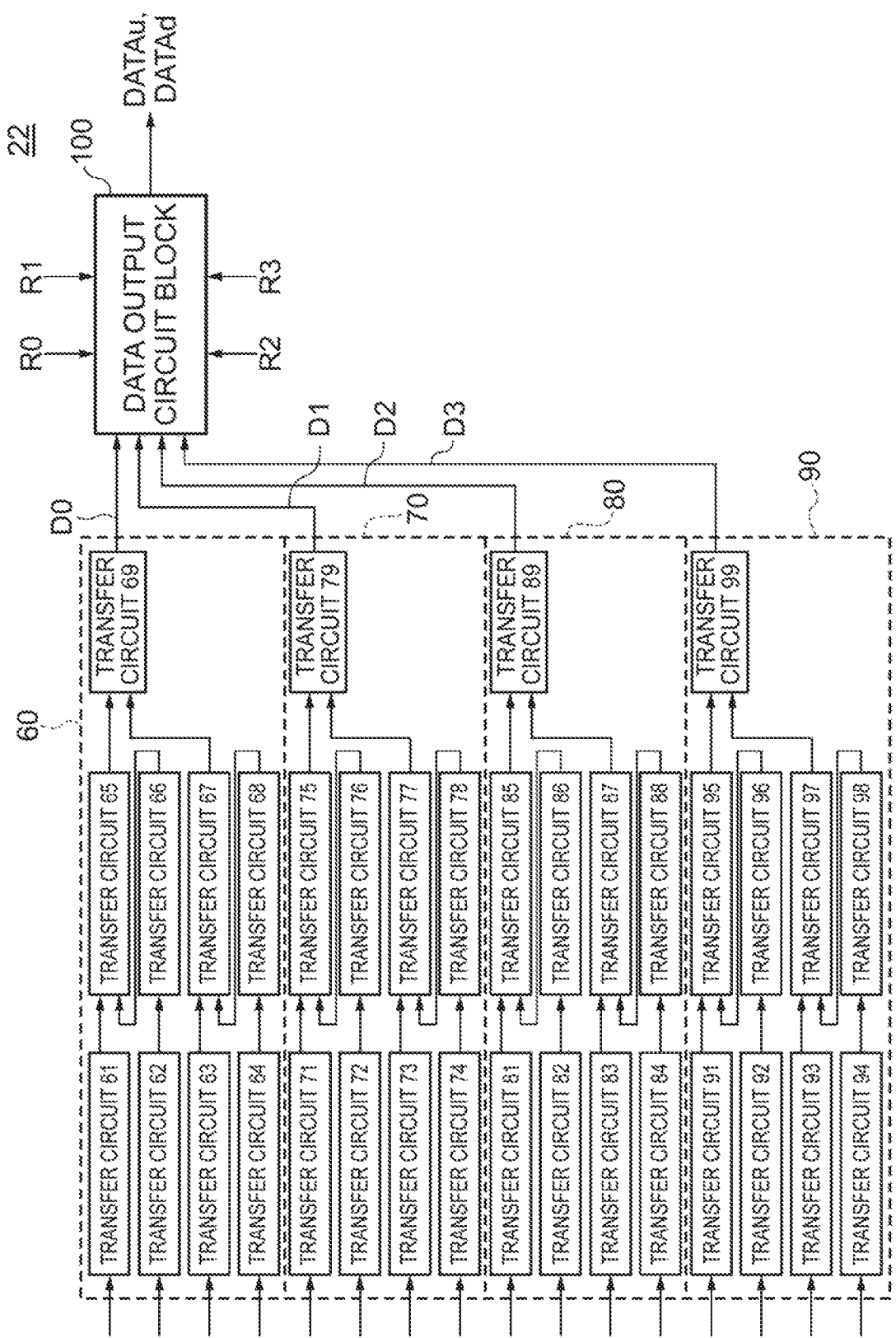
FIG. 9 is a circuit diagram of a read clock synchronization circuit.

FIG. 8 is a layout diagram of the read clock synchronization circuit 22, and FIG. 9 is a circuit diagram of the read clock synchronization circuit 22. As shown in FIGS. 8 and 9, the read clock synchronization circuit 22 includes four data transfer circuit blocks 60, 70, 80, and 90, and a data output circuit block 100. The data transfer circuit blocks 60, 70, 80, and 90 each serve a function to convert four-bit parallel read data into serial data and transfer the serial data to the data output circuit block 100. While the data transfer circuit blocks 90, 70, 60, and 80 are arranged in this order in the x direction in an example shown in FIG. 8, the layout of the data transfer circuit blocks is not limited thereto.

The data transfer circuit block 60 includes transfer circuits 61 to 69. Parallel four-bit read data input to the data transfer circuit block 60 are first input to the transfer circuits 61 to 64, respectively. Data loaded into the transfer circuits 61 to 64 are transferred to the transfer circuits 65 to 68, respectively. Data loaded into the transfer circuits 66 and 68 are transferred to the transfer circuits 65 and 67, respectively, and data transferred to the transfer circuits 65 and 67 are transferred to the data output circuit block 100 via the transfer circuit 69. Accordingly, the parallel four-bit read data are converted into serial data and are transferred as read data D to the data output circuit block 100. The same holds for other data transfer circuit blocks 70, 80, and 90 and parallel four-bit read data are converted into serial data to be transferred as read data D1 to D3 to the data output circuit block 100, respectively.

Figure 10:
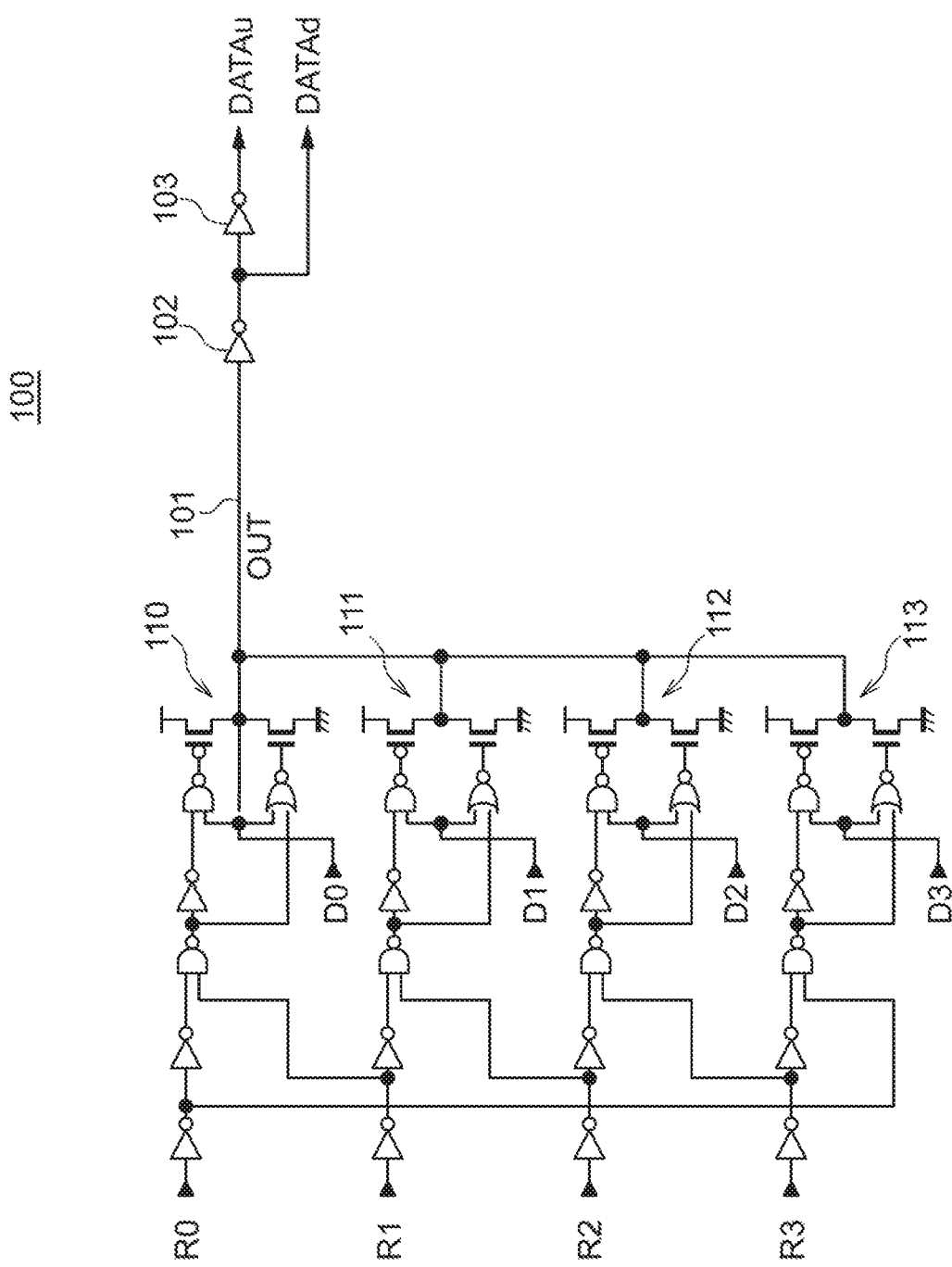
FIG. 10 is a circuit diagram of a data output circuit block.
Figure 11:
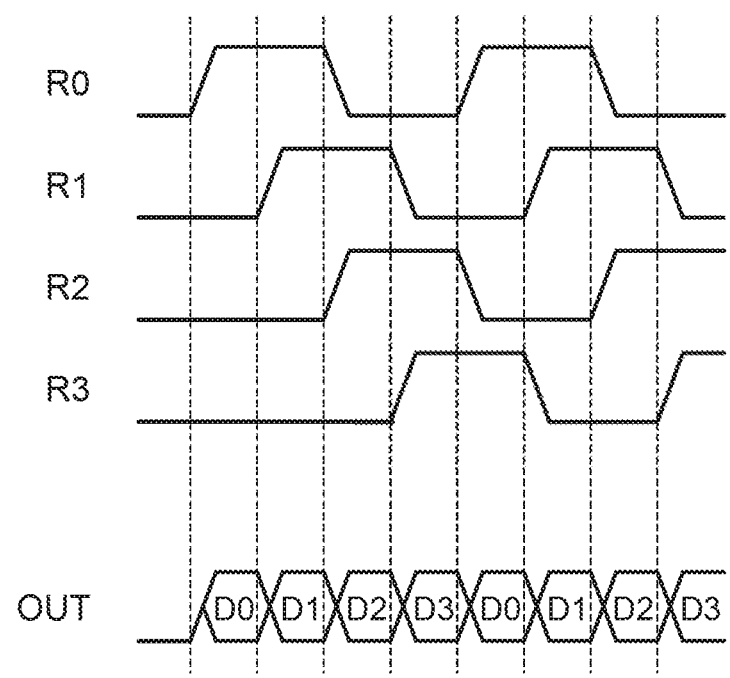
FIG. 11 is a timing chart for explaining an operation of the data output circuit block.

FIG. 10 is a circuit diagram of the data output circuit block 100. As shown in FIG. 10, the data output circuit block 100 has four tristate buffer circuits 110 to 113. One of the tristate buffer circuits 110 to 113 is activated and the remaining three tristate buffer circuits have outputs in a high impedance state on the basis of the read clock signals R0 to R3. Output nodes of the tristate buffer circuits 110 to 113 are connected in common to a signal node 101. The read clock signals R0 to R3 are four-phase clock signals different in phase from one another by 90 degrees as shown in FIG. 11. The tristate buffer circuits 110 to 113 output the read data D0 to D3 to the signal node 101 in response to rising edges of the read clock signals R0 to R3, respectively. Therefore, the frequency of the serial read data D0 to D3 appearing on the signal node 101 is four times as high as the frequency of the parallel read data D0 to D3 input to the data output circuit block 100.

Inverter circuits 102 and 103 are cascade-connected at the subsequent stage of the signal node 101. The output of the inverter circuit 103 is used as the pull-up data DATAu and the output of the inverter circuit 102 is used as the pull-down data DATAd. The pull-up data DATAu and the pull-down data DATAd are supplied to the driver circuit 23.

Figure 12:
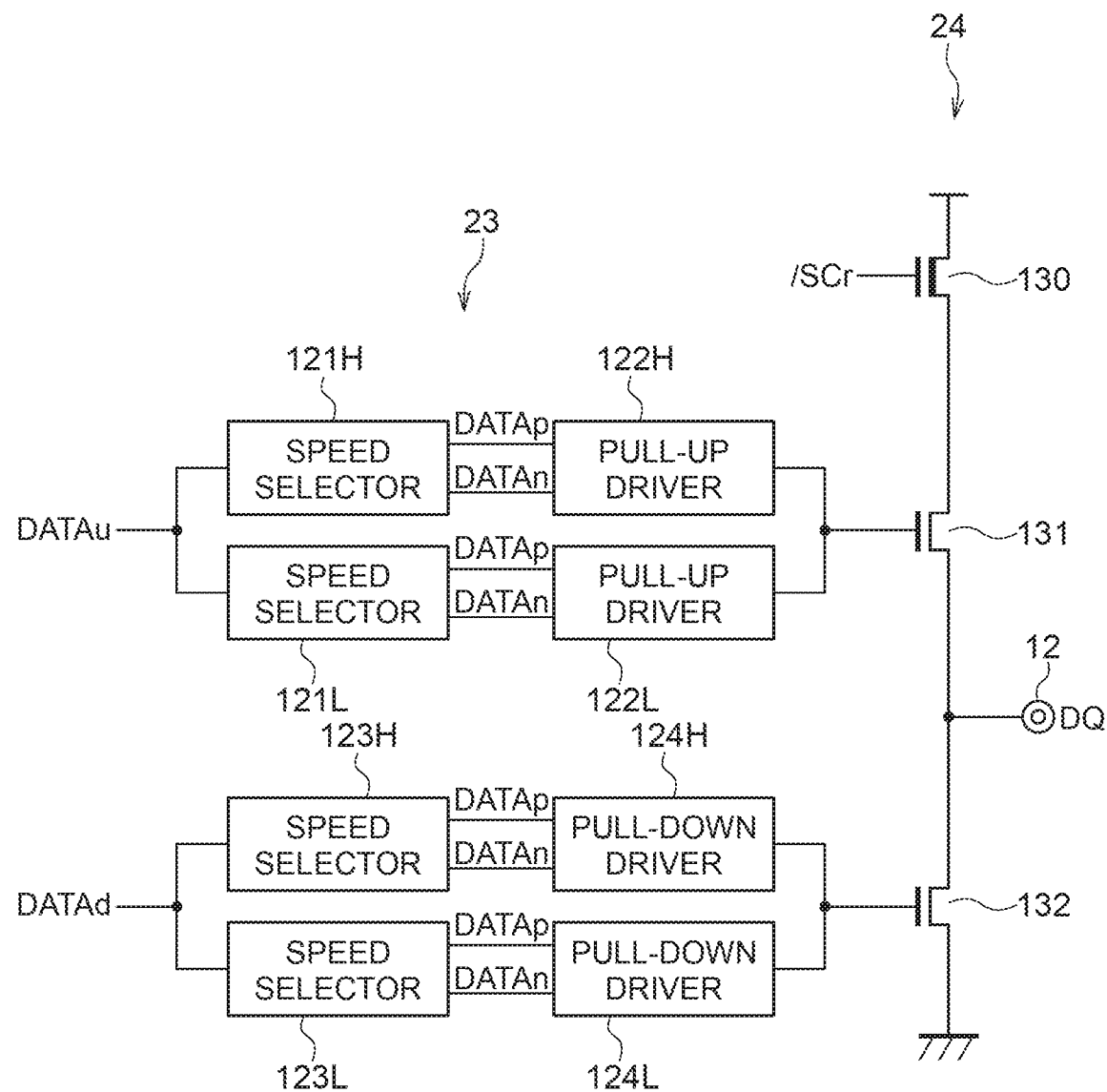
FIG. 12 is a circuit diagram of a driver circuit and an output buffer.

FIG. 12 is a circuit diagram of a driver circuit 23 and an output buffer 24. The driver circuit 23 has speed selectors 121H and 121L that receive the pull-up data DATAu, and speed selectors 123H and 123L that receive the pull-down data DATAd. The speed selectors 121H and 123H are activated when a high-speed mode is selected, and generate data signals DATAp, DATAn on the basis of the pull-up data DATAu and the pull-down data DATAd, respectively. The data signals DATAp, DATAn output from the speed selectors 121H and 123H are supplied to a pull-up driver 122H and a pull-down driver 124K respectively. The speed selectors 121L and 123L are activated when a low-speed mode is selected, and generate the data signals DATAp, DATAn on the basis of the pull-up data DATAu and the pull-down data DATAd, respectively. The data signals DATAp, DATAn output from the speed selectors 121L and 123L are supplied to a pull-up driver 122L and a pull-down driver 124L, respectively.

The output buffer 24 includes a switch transistor 130, an output transistor 131, and an output transistor 132 connected in series. The switch transistor 130 is an N-channel MOS transistor having a thickened gate dielectric film, and a reset signal/SCr is supplied to a gate electrode thereof. The reset signal/SCr becomes a high level at the time of a read operation. Outputs of the pull-up drivers 122H and 122L are wired-OR connected to be supplied to a gate electrode of the transistor 131. Outputs of the pull-down drivers 124H and 124L are wired-OR connected to be supplied to a gate electrode of the transistor 132.

Figure 13:
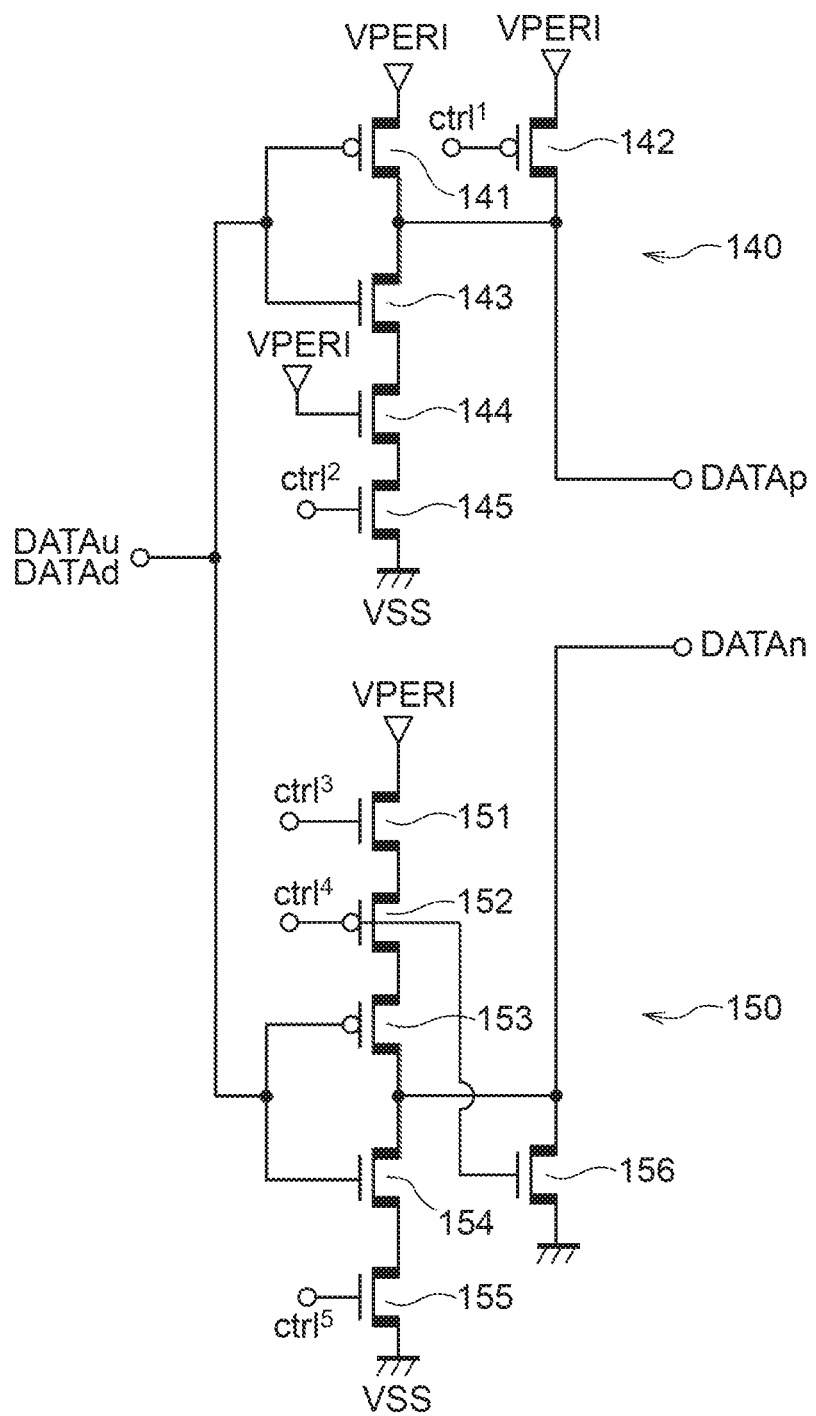
FIG. 13 is a circuit diagram of speed selectors.

FIG. 13 is a circuit diagram of the speed selectors. Each of the speed selectors includes a NAND gate circuit 140 and a NOR gate circuit 150. The NAND gate circuit 140 generates the data signal DATAp on the basis of the pull-up data DATAu or the pull-down data DATAd and control signals ctrl1 and ctrl2. High-speed transistors having a lowered threshold voltage are used as transistors 141 to 145 constituting the NAND gate circuit 140. The NOR gate circuit 150 generates the data signal DATAn on the basis of the pull-up data DATAu or the pull-down data DATAd and control signals ctrl3 to ctrl5. High-speed transistors having a lowered threshold voltage are used also as transistors 151 to 156 constituting the NOR gate circuit 150. The control signals ctrl1 to ctrl5 are a speed mode signal, a timing signal, a non-target ODT (on-die termination) enable signal, or a signal obtained by a logic synthesis of these signals.

Figure 14:
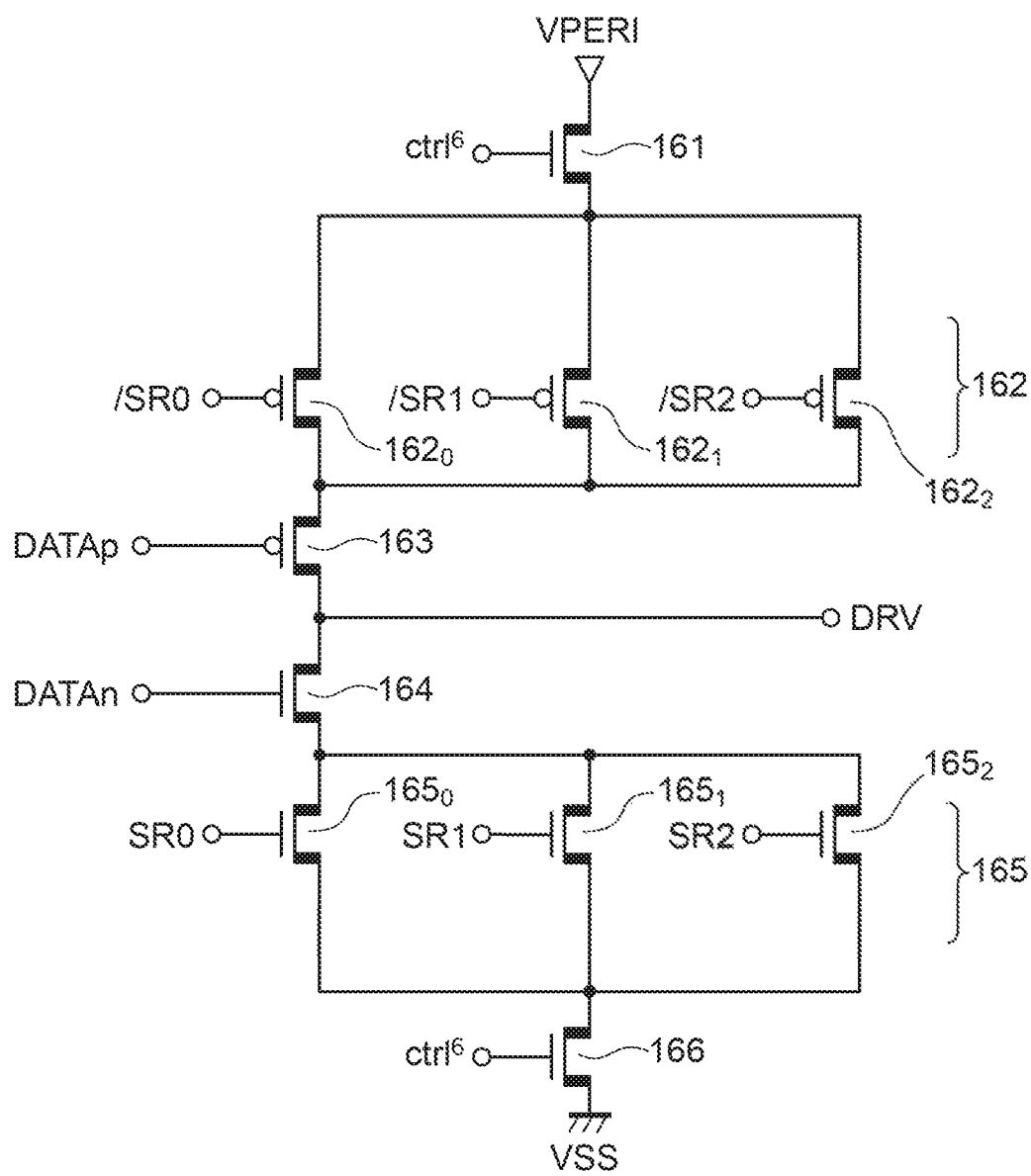
FIG. 14 is a circuit diagram of a pull-up driver or a pull-down driver.

FIG. 14 is a circuit diagram of the pull-up driver or the pull-down driver. The pull-up driver or the pull-down driver is a tristate buffer having transistors 161 to 166 connected in series, and a drive signal DRV is output from a connection point between the transistor 163 and the transistor 164. The data signal DATAp is supplied to a gate electrode of the transistor 163 and the data signal DATAn is supplied to a gate electrode of the transistor 164. The transistors 161 and 166 are transistors for activating the relevant pull-up driver or pull-down driver, and a control signal $ctrl^6$ obtained by a logic synthesis of the speed mode signal and the timing signal is input to gate electrodes thereof. The transistors 161 and 166 can be high-voltage transistors having a thickened gate dielectric film. When the transistors 161 and 166 are turned off, the relevant pull-up driver or pull-down driver is deactivated and the output node thereof becomes a high impedance state. The transistor 162 is constituted by a plurality of transistors $162_0$ to $162_2$ connected in parallel and the transistor 165 is constituted by a plurality of transistors $165_0$ to $165_2$ connected in parallel. Inverted signals of bits SR0 to SR2 (e.g., /SR0 to/SR2) constituting a slew rate code signal SR are supplied to gate electrodes of the transistors $162_0$ to $162_2$, respectively. The bits SR0 to SR2 constituting the slew rate code signal SR are supplied to gate electrodes of the transistors $165_0$ to $165_2$, respectively. The slew rate code signal SR can include impedance code information.

Figure 15:
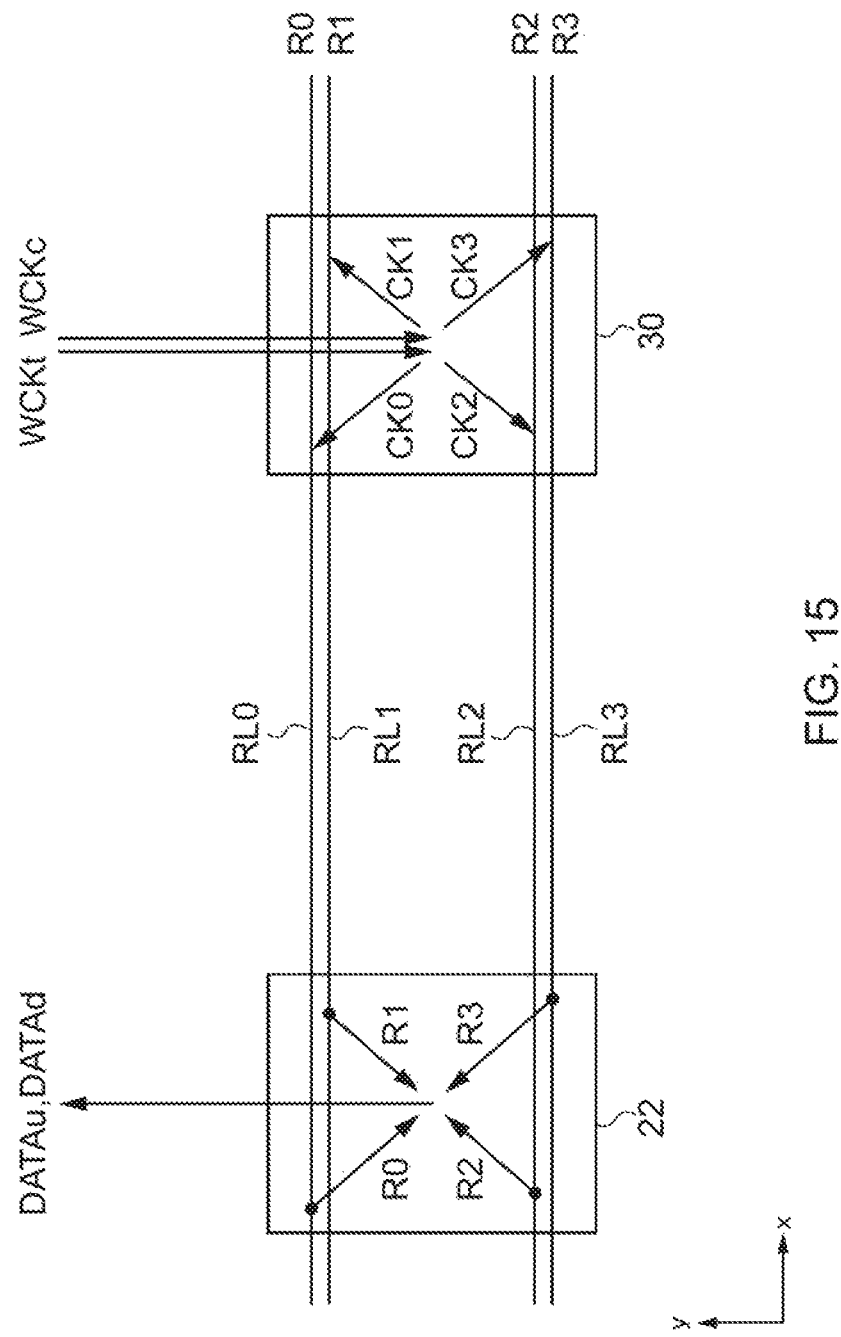
FIG. 15 is a schematic diagram for explaining a flow of divided clock signals and read clock signals.

With this configuration, one of the transistors 131 and 132 constituting the output buffer 24 is turned ON on the basis of the pull-up data DATAu and the pull-down data DATAd and the read data DQ of a high level or a low level is output from the data terminals 12 at the time of a read operation. The semiconductor device 10 according to the present disclosure inputs the clock signals WCKt and WCKc supplied from outside to a substantially central pan of the clock signal generation circuit 30, and radially outputs the four-phase divided clock signals CK0 to CK3 on the basis of the clock signals WCKt and WCKc as shown in FIG. 15. The read clock signals R0 to R3 generated on the basis of the divided clock signals CK0 to CK3 are transmitted via the read clock lines RL0 to RL3 extending in the x direction and are supplied to the read clock synchronization circuit 22. The read clock synchronization circuit 22 centralizes the read clock signals R0 to R3 and performs a parallel to serial conversion operation on the basis of the read clock signals R0 to R3, thereby generating the pull-up data DATAu and the pull-down data DATAd.

On the other hand, at the time of a write operation, the write data DQ input to the data terminals 12 is supplied to the input buffer 25. The input buffer 25 converts the serial write data DQ into parallel four-bit write data DQ on the basis of the write clock signals W0 to W3. The timings of the parallel four-bit write data DQ adjusted by the timing adjustment circuit 26. Thereafter, the parallel four-bit write data DQ we further converted into parallel 16-bit write data DQ by the write clock synchronization circuit 27 and are output to the read/write buses 16 via the write data output circuit 28.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a clock generator configured to generate first, second, third, and fourth clock signals different in phase from one another; and
   first, second, third, and fourth clock drivers each configured to drive the first, second, third, and fourth clock signals, respectively,
   wherein the first and second clock drivers are arranged symmetrically with respect to a first line extending in a first direction,
   wherein the first and third clock drivers are arranged symmetrically with respect to a second line extending in a second direction, and
   wherein the first and fourth clock drivers are arranged symmetrically with respect to a point crossing the first and second lines.

2. The apparatus of claim 1, wherein the third and fourth clock drivers are arranged symmetrically with respect to the first line.

3. The apparatus of claim 2, wherein the second and fourth clock drivers are arranged symmetrically with respect to the second line.

4. The apparatus of claim 3, wherein the second and third clock drivers are arranged symmetrically with respect to the point.

5. The apparatus of claim 4, wherein the first direction is perpendicular to the second direction.

6. The apparatus of claim 5, wherein phases of the first, second, third, and fourth clock signals are different in phase from one another by 90 degrees.

7. The apparatus of claim 6, wherein the clock generator is configured to generate the first, second, third, and fourth clock signals by dividing a base clock signal.

8. The apparatus of claim 7, wherein the base clock signal includes first and second base clock signals complementary with each other.

9. The apparatus of claim 1, wherein each of the first, second, third, and fourth clock drivers includes a write clock driver and a read clock driver.

10. The apparatus of claim 9, wherein the clock generator is surrounded by the write clock drivers included in the first, second, third, and fourth clock drivers.

11. The apparatus of claim 10, wherein the write clock drivers included in the first, second, third, and fourth clock drivers are surrounded by the read clock drivers included in the first, second, third, and fourth clock drivers.

12. The apparatus of claim 11, further comprising first, second, third, and fourth write clock signal lines extending in the second direction,
wherein the write clock drivers included in the first, second, third, and fourth clock drivers are configured to output first, second, third, and fourth write clock signals to the first, second, third, and fourth write clock signal lines, respectively.

13. The apparatus of claim 12, wherein the point is located between the first and second write clock signal lines and the third and fourth write clock signal lines.

14. The apparatus of claim 13, further comprising first, second, third, and fourth read clock signal lines extending in the second direction,
wherein the read clock drivers included in the first, second, third, and fourth clock drivers are configured to output first, second, third, and fourth read clock signals to the first, second, third, and fourth read clock signal lines, respectively.

15. The apparatus of claim 14, wherein the first to fourth write clock signal lines are located between the first and second read clock signal lines and the third and fourth read clock signal lines.

16. An apparatus comprising:
a first external terminal electrode supplied with a first external clock signal;
a second external terminal electrode supplied with a second external clock signal;
a clock generator configured to generate first, second, third, and fourth internal clock signals different in phase from one another by dividing the first and second external clock signals; and
first, second, third, and fourth clock drivers each configured to drive the first, second, third, and fourth clock signals, respectively,
wherein the clock generator is surrounded by the first, second, third, and fourth clock drivers.

17. The apparatus of claim 16, wherein the first and second external clock signals are complementary with each other.

18. The apparatus of claim 17, wherein each of the first, second, third, and fourth clock drivers includes a write clock driver and a read clock driver.

19. The apparatus of claim 18, further comprising a parallel to serial converter configured to convert a read data in parallel to serial,
wherein the read clock drivers included in the first, second, third, and fourth clock drivers are configured to generate first, second, third, and fourth read clock signals, respectively, and
wherein parallel to serial converter is configured to perform a converting operation in synchronization with the first, second, third, and fourth read clock signals.

20. The apparatus of claim 19, further comprising a serial to parallel converter configured to convert a write data in serial to parallel,
wherein the write clock drivers included in the first, second, third, and fourth clock drivers are configured to generate first, second, third, and fourth write clock signals, respectively, and
wherein serial to parallel converter is configured to perform a converting operation in synchronization with the first, second, third, and fourth write clock signals.

* * * * *